(12) United States Patent
Boor

(10) Patent No.: US 6,960,816 B2
(45) Date of Patent: Nov. 1, 2005

(54) SYSTEM AND METHOD FOR SENSING A MAGNETIC FIELD

(75) Inventor: Steven E. Boor, Plano, TX (US)

(73) Assignee: Knowles Electronics, LLC., Itasca, IL (US)

(*) Notice: Subject to any disclaimer, the term of this patent is extended or adjusted under 35 U.S.C. 154(b) by 0 days.

(21) Appl. No.: 10/834,501

(22) Filed: Apr. 28, 2004

(65) Prior Publication Data

US 2004/0212029 A1 Oct. 28, 2004

Related U.S. Application Data

(60) Provisional application No. 60/465,993, filed on Apr. 28, 2003.

(51) Int. Cl.$^7$ ............................................. H01L 29/82
(52) U.S. Cl. ...................................... 257/423; 257/427
(58) Field of Search ................................ 257/423, 427

(56) References Cited

U.S. PATENT DOCUMENTS

| 4,032,953 | A | | 6/1977 | Suzuki |
|---|---|---|---|---|
| 4,546,539 | A | * | 10/1985 | Beasom ....................... 438/324 |
| 4,700,211 | A | | 10/1987 | Popovic et al. |
| 4,723,250 | A | * | 2/1988 | Ohkawa et al. ............... 372/37 |
| 4,823,173 | A | * | 4/1989 | Beasom ....................... 257/262 |
| 5,393,678 | A | | 2/1995 | Ristic |
| 5,773,338 | A | * | 6/1998 | Shibib ....................... 438/202 |
| 5,834,826 | A | * | 11/1998 | Menegoli ..................... 257/546 |
| 6,278,271 | B1 | | 8/2001 | Schott |
| 2003/0020470 | A1 | | 1/2003 | Hatanaka |
| 2003/0094943 | A1 | | 5/2003 | Ashley et al. |

FOREIGN PATENT DOCUMENTS

| DE | 100 36 007 A1 | 2/2002 |
|---|---|---|
| EP | 0 097 850 A1 | 1/1984 |
| EP | 1 302 778 A2 | 4/2003 |

OTHER PUBLICATIONS

Woo et al., "Lateral NPN Bipolar Transistor for High Current Gain Applications at Reduced Temperatures," Sep. 18, 1989, pp. 152–155.
International Search Report for Application No.: PCT/US2004/013179 dated Oct. 25, 2004.

* cited by examiner

*Primary Examiner*—Allan R. Wilson
(74) *Attorney, Agent, or Firm*—Marshall, Gerstein & Borun LLP

(57) ABSTRACT

A magnetic field sensor includes a transistor device having a base region, an emitter region, and a collector region. A barrier region disposed between the emitter region and the collector region to hamper charge carriers injected into the base region from the emitter region from reaching at least a portion of the collector region. The magnetic field sensor further includes a first voltage source to bias the collector region with respect to the base region to form a space-charge layer associated with the collector region.

10 Claims, 1 Drawing Sheet

SYSTEM AND METHOD FOR SENSING A MAGNETIC FIELD

CROSS-REFERENCE TO RELATED PATENT APPLICATIONS

This patent claims the benefit of U.S. Provisional Patent Application Ser. No. 60/465,993, filed Apr. 28, 2003, the disclosure of which is hereby incorporated herein by reference in its entirety for all purposes.

TECHNICAL FIELD

This patent generally relates to magnetic field sensors used in assisted-listening devices, such as hearing aids or the like, and more particularly, to a low-power solid state magnetic field (B-field) detector with increased sensitivity.

BACKGROUND

Assisted-listening devices, e.g. hearing aids or the like, should be capable of operating in, and being adaptable to, several environmental conditions. For example, the assisted-listening device should be capable of automatically selecting amongst various audio sources, e.g. telecoil, microphone or auxiliary. There are several possible magnetic field sensors available to measure magnetic fields or B-fields produced by electric currents or the earth's magnetic field, such as, for example a semiconductor magnetic field sensor, a standard Hall effect sensor, or the like. These sensors are can be utilized as detectors for the static B-field of a telephone handset. The silicon external B-field detectors may include: a lateral bipolar magnetotransistor (LBMT), a split-drain MAGFET, or a micro-electromechanical system (MEMS) type device. One commercially available hearing aid utilizes a magnetic reed switch to provide magnetic field detection and automatic transducer mode selection. Unfortunately, there are a number of limitations associated with utilizing the magnetic reed switch. Frequently, the reed switch lacks the sensitivity to operate with many types of telephones and often requires placing an external magnet onto the telephone handset earpiece.

Additionally, the reed switch requires use of a portion of the communication device, such as a very limited space within the hearing aid. Furthermore, the reed switch may be susceptible to damage or performance changes if the hearing aid is dropped or subjected to extremely high magnetic fields—thus undermining the effective reliability of the assisted-listening system. Another shortcoming involves the added costs that are incurred to implement the reed switch into the assisted-listening system due to the additional components and manufacturing effort required.

The LBMT sensor is used to detect magnetic fields that are parallel to the surface of a semiconductor, and is a very sensitive silicon magnetic field sensor device typically having a sensitivity of 100% change in lateral collector current per Telsa. Most conventional LBMT devices require a fairly large, eg., several mA, extrinsic base current to flow so that an enhanced Lorentz force on the majority carriers making up the high extrinsic base current can establish an electric field to divert the laterally diffusing minority carriers.

Accordingly, it would be advantageous to have a LBMT and a method for making the LBMT with increased sensitivity and low power dissipation to operate in many low-power portable applications. It would be of further advantage that the LBMT utilize less power for detecting the presence of a static external magnetic field—often referred to as a B-field commonly associated with a telephone handset, or the like.

BRIEF DESCRIPTION OF THE DRAWINGS

For a more complete understanding of the invention, reference should be made to the following detailed description and accompanying drawings wherein.

DETAILED DESCRIPTION

Figure 1:
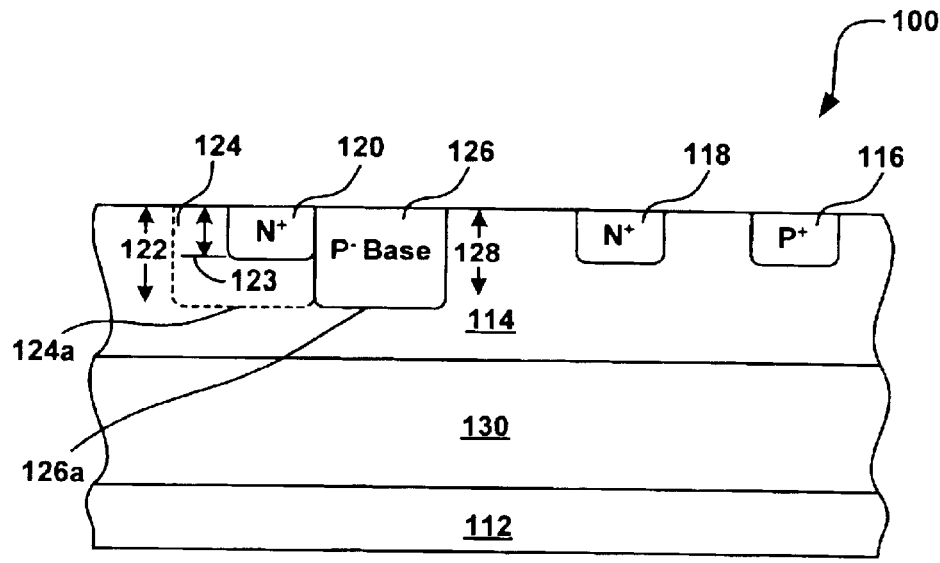
FIG. 1 is a cross-sectional view of a semiconductor magnetic field sensor utilizing one embodiment of the invention.

While the present invention is susceptible to various modifications and alternative forms, certain embodiments are shown by way of example in the drawings and these embodiments will be described in detail herein. It will be understood, however, that this disclosure is not intended to limit the invention to the particular forms described, but to the contrary, the invention is intended to cover all modifications, alternatives, and equivalents falling within the spirit and scope of the invention defined by the appended claims.

It should also be understood that, unless a term is expressly defined in this patent using the sentence "As used herein, the term '_____' is hereby defined to mean . . ." or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term by limited, by implication or otherwise, to that single meaning. Unless a claim element is defined by reciting the word "means" and a function without the recital of any structure, it is not intended that the scope of any claim element be interpreted based on the application of 35 U.S.C. §112, sixth paragraph.

Embodiments of the invention described herein provide a method for improving the sensitivity of a magnetic field sensor. The many features and advantages of the invention include providing a simple, low power electronic switch for detecting the presence of a static B-field commonly associated with various audio sources, such as, for example, a telecoil, microphone, auxiliary input, or the like.

As will be appreciated from the following description of embodiments, a magnetic field sensor includes a silicon substrate. An $N^+$ buried layer region is formed above the silicon substrate. A base region is formed above the $N^+$ buried layer region. At least one base contact and one emitter region are contained within the base region. At least one collector region having a depth and establishing a space-charge layer (SCL) is contained within the base region. The SCL width established by the collector within the base region is responsive to a voltage bias applied across the collector region and the base region. At least one $P^-$ base impurity diffusion region having a depth is disposed between the collector region and the emitter region. The $P^-$ base impurity diffusion region is adjacent to the collector region. The SCL is adaptive with respect to the depth of the $P^-$ base impurity diffusion region wherein a substantial amount of electrons injected from the emitter region are hampered from reaching the collector region near the silicon surface.

In an alternate described embodiment, a first and second deep N-type sinker portions are formed in contact with the N+ buried layer region. At least one lateral collector and parasitic collector region each having a depth and establishing multiple SCLs is disposed within the base region. The lateral collector SCL in the base region is responsive to a voltage bias applied across the lateral collector region and the base region. A first parasitic collector region is adjacent and disposed above the first deep N-type sinker portion of the N+ buried layer region. A second parasitic collector region is adjacent and disposed above the second deep N-type sinker portion of the N+ buried layer region. The base region is disposed above the N+ buried layer region, which also acts as a parasitic collector, and between the first and second deep N-type sinker portions such that the base region is completely surrounded on the sides and bottom, which effectively isolates the base region from the P-type silicon substrate. At least one base contact and an emitter region are disposed within the base region.

In another described embodiment, an N-type shield region is disposed within the base region and includes a depth and also establishes a SCL in the base region. The SCL established by the shield region is responsive to a voltage bias applied across the shield region and the base region. A channel, essentially the same as that of a P-channel JFET (P-JFET), is disposed within the base region and its width is defined by the space-charge layers established by the N+ buried layer region, the deep N-type sinker regions, and the N-type shield region. A conductor operably connects the first deep N-type sinker portion and the second deep N-type sinker portion together for biasing, and the shield region is operably connected via a conductor to its biasing source, which may or may not be the same as that used for the two sinker portions. At least one base contact and at least one emitter region are disposed within the base region. The channel thickness is adaptive to the space-charge layers established by the N+ buried layer region, the first and second deep N-type sinker regions, and the shield region for substantially reducing the flow of electrons laterally injected from the emitter region that can reach the collector region near the silicon surface.

FIG. 1 depicts a cross-sectional view of a semiconductor magnetic field sensor 100 utilizing one embodiment of the invention. The sensor 100 is a lateral bipolar magnetotransistor (LBMT) comprising a lateral NPN transistor. However, it will be understood by those or ordinary skill in the art that the sensor 100 may alternatively comprise a lateral PNP transistor. The sensor 100 includes a P-type silicon substrate 112, an N+ buried layer region 130, and a P-type base region 114. The N+ buried layer region 130 is disposed between the silicon substrate 112 and the P-type base region 114. The P-type base region 114 may be a P-well, or a more lightly doped P-epi region having a lower electron energy barrier, and is formed above the N+ buried layer region 130. A P+ base ohmic contact 116 is formed within the P-type base region 114 by heavy doping of the Silicon with a P-type impurity. An N+ emitter region 118 is formed within the P-type base region 114 by heavy doping of the Silicon with an N-type impurity. A N-type collector region 120 having a depth 123 which may be, for example, approximately 0.5 $\mu$m thick, establishes a space-charge layer (SCL) 124 having a depth 122 within the P-type base region 114 by the heavy doping of silicon with an N-type impurity.

In alternate embodiments, the collector region 120 may take various concentrations and configurations of dopants and profiles, such as, for example, N+, N−, or Deep N+ type diffusions commonly available in a typical Silicon BiCMOS IC process. The SCL 124 may normally function as an insulator to prevent majority carriers from flowing through the P-type base region 114 due to the minimal amount of free carriers present therein. Conversely, the electric field in the SCL 124 establishes a highly attractive force upon minority carriers, and acts to accelerate them toward the associated P-N junction. A key insight into the operation of LBMT sensors is that all of their inherent B-field sensitivity effectively occurs only near the very bottom edge of the lateral collector SCL 124, which provides a physical location whereby the lateral collector current can be either increased or decreased by the B-field induced Lorentz forces that divert the laterally diffusing minority carriers.

The SCL 124 of the P-type base region 114 associated with the collector region 120 is responsive to a voltage bias applied across the collector region 120 and the P-type base region 114. A P− base impurity diffusion region 126 having a depth 128 which may be, for example, approximately 2 $\mu$m, formed within the P-type base region 114 by additional P-type impurity doping and is adjacent to the collector region 120. The SCL 124 of the P-type base region 114 associated with the collector region 120 is adaptive in its collection efficiency with respect to the depth of the P− base impurity diffusion region 126, wherein a substantial flow of electrons laterally injected from the emitter region 118 are hampered from reaching the collector region 120 near the surface of the silicon substrate 112 where the inherent LBMT device B-field sensitivity is low.

The P− base impurity diffusion region 126 near the silicon surface provides a higher potential barrier to electrons as they diffuse laterally from the emitter region 118 toward the collector region 120. The higher energy barrier to electrons of the P− base impurity diffusion region 126 with respect to the P-type base region 114 establish an electric field near the silicon surface that acts as a shield and repels the laterally diffusing electrons away from the silicon surface and downward further into the body of the semiconductor. Formed in this manner, the LBMT device has the advantage of increased magnetic field sensitivity to operate with many low-power portable applications since the P-type base region 114 will cause a substantial fraction of the diffusing electrons to travel downward into the silicon towards a bottom surface 124a of the SCL 124. Thus the P− base impurity diffusion region 126 may effectively direct the uppermost portion of the stream of laterally diffusing electrons deeper into the silicon towards the bottom surface 124a of the SCL 124, which is where the LBMT device 100 has its highest sensitivity to an external magnetic field.

At a certain reverse-bias voltage between the collector region 120 and the base contact 116 ($V_{BE}$ being forward biased for reasonable lateral minority carrier current injection), it is conceivable that the bottom surface 124a of the SCL 124 may be raised or lowered (e.g. the depth 128 may be changed) to increase the B-field sensitivity of the LBMT 100. This increased magnetic field sensor sensitivity may occur if the bottom surface 124a is electronically adjusted by optimizing the collector region 120 and the base contact 116 ($V_{CB}$) reverse-bias voltage, so that the bottom surface 124a becomes nearly coincident with a bottom surface 126a of the P− base impurity diffusion region 126. If the bottom surface 124a of the SCL 124 is adjusted precisely to the same diffusion depth as the P− base impurity diffusion region 126 (e.g., the depth 122 equals the depth 128 which may be a diffusion depth of approximately 2 $\mu$m) via the $V_{CB}$ reverse-bias voltage, the SCL 124 may barely collect any of the laterally diffusing electrons, which would make the lateral collector current extremely sensitive to the vertical displacement of electrons from the Lorentz force caused by the B-field.

In an alternate embodiment, a desirable type of collector region 120 described earlier may allow for utilizing lateral collector bias voltages that are within the typical power supply range of a hearing aid battery, and provide for a bottom surface 124a of the SCL 124 to have a depth 122 very close to the depth 128 of the bottom surface 126a of the P⁻ base impurity diffusion region 126 maximum downward extent of the P⁻ base impurity diffusion region 126.

Figure 2:
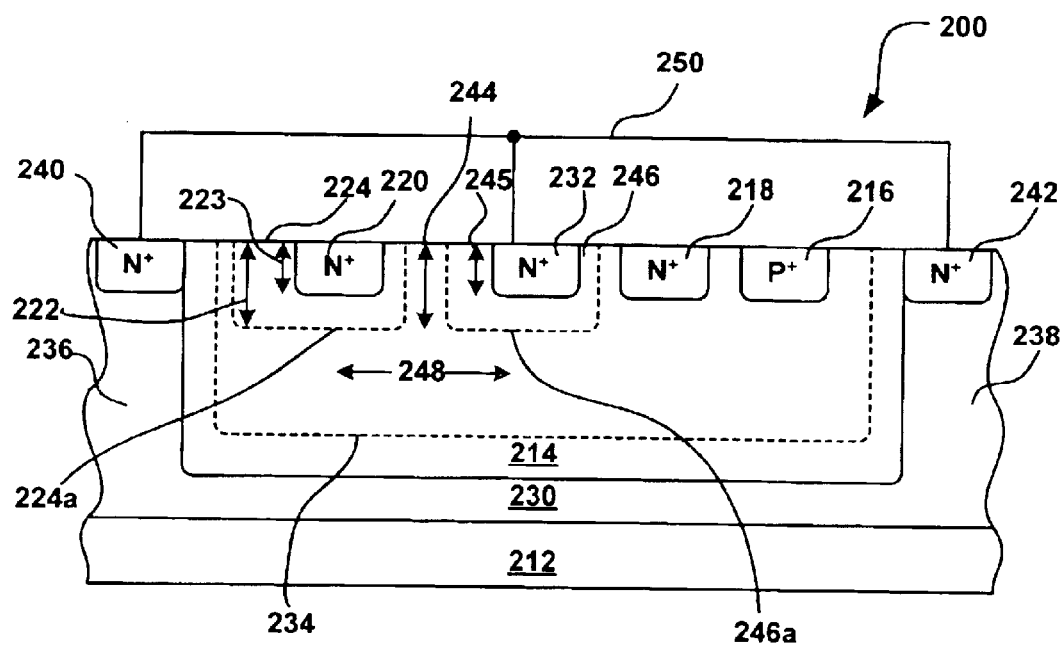
FIG. 2 is a cross-sectional view of another described embodiment of a semiconductor magnetic field sensor of the invention.

FIG. 2 depicts an alternate embodiment of a semiconductor magnetic field sensor 200, similar to the one illustrated in FIG. 1 as semiconductor magnetic field sensor 100. It is to be understood that the present invention may be embodied in these and other configurations. As shown in FIG. 2, a cross-sectional view of sensor 200 includes a silicon substrate 212, an N⁺ buried layer region 230, and a P-type base region 214. The N⁺ buried layer region 230 includes a first N-type sinker portion 236 and a second N-type sinker portion 238 formed on the silicon substrate 212 by heavy doping of the Silicon with an N-type dopant. A first N⁺ contact region 240 is adjacent to, and formed above, the first N-type sinker portion 236 connected to the N⁺ buried layer region 230. An optional second N⁺ contact region 242 is adjacent and formed above the second N-type sinker portion 238 connected to the N⁺ buried layer region 230. The P-type base region 214 may be a P-well, or P-epi having a lower energy barrier, and is formed above the N⁺ buried layer region 230 and laterally between the first and second N-type sinker portions 236, 238.

A P-type base ohmic contact 216 is formed within the P-type base region 214 by heavily doping the Silicon with a P-type impurity. An N-type emitter region 218 is preferably grounded and formed within the P-type base region 214 by heavily doping the Silicon with an N-type impurity. A collector region 220 having a depth 223, which may be, for example, approximately 0.5 μm, establishes a space-charge layer (SCL) 224 having a depth 222 within the P-type base region 214 by heavily doping the silicon with an N-type impurity.

In alternate embodiments, the collector region 220 may consist of various concentrations and configurations of dopants and profiles, such as, for example, N⁺, N⁻, or Deep N⁺ type diffusions typically available in a Silicon BiCMOS IC process. The SCL 224 associated with the collector region 220 is responsive to a voltage bias applied across the collector region 220 and the P-type base region 214. A shield region 232 having a typical depth of 245, which may be, for example, approximately 0.5 μm, establishes an SCL 246 having a depth 244 within the P-type base region 214. The SCL 246 is responsive to a voltage bias applied across the shield region 232 and P-type base region 214. A neutral P-epi or P-well region or channel 248 is formed within the P-type base region 214 and is enclosed by a SCL 234 and the N⁺ buried layer region 230, the first and second N-type sinker portions 236, 238, and the SCL 246 of the shield region 232.

The first and second N-type sinker regions 236, 238 and the N⁺ buried layer region 230 typically are electrically connected in common to the shield region 232 and act as parasitic collectors to prevent electrons from reaching the lateral collector region 220. However, electrons that diffuse laterally through the channel 248 within the base region 214 and substantially near the bottom surface 224a of the SCL 224 are able to reach the collector region 220. A conductor 250 is biased and operably connected to the first N⁺ contact region 240, the second N⁺ contact region 242, and the shield region 232. Moreover, the channel 248 is adaptive, e.g., narrowed or widened, by the SCLs 246 and 234 for limiting the amount of electrons injected from the emitter region 218 that may reach the collector region 220 near the bottom surface 224a of the SCL 224. Alternatively, the shield region 232 may be operably connected to a separate conductor and biasing source from the first and second N⁺ contact regions 240, 242. Preferably, the voltage potential across the various regions of the LBMT device 200 may be configured as follows: the emitter region 218 and the base region 216 ($V_{BE}$) being forward biased; the collector region 220 and base region 216 ($V_{CB}$) being reversed biased; the shield region 232 and the base region 216 ($V_{SB}$) being reversed biased or very weakly forward biased; and the emitter region 218 may be biased at some intermediate voltage or grounded.

When the P-JFET channel 248, (i.e., the neutral P-epi or P-well region), of the LBMT device 200 is made extremely narrow, (i.e., when the shield region 232 is reverse biased so that the width of the SCLs 234, 246 in the P-type base region 214 expand and approach each other to almost completely pinch-off the entire P-base channel region 248), it is expected that either polarity of the B-field will reduce the minority carrier current flow to the collector region 220 resulting in an extremely high B-field sensitivity for the LBMT device. In other words, high magnetic field sensitivity is expected because the weak Lorentz force even at low level B-fields will divert the laterally diffusing minority carriers in the narrow P-base region to one of the closely spaced SCLs 234, 246 associated with the top or bottom parasitic collectors, thereby diminishing the lateral collector current as the B-field magnitude increases for either polarity of increasing B-field. In essence, for very narrow channel 248 thicknesses, this type of LBMT device 200 can operate as a B-field switch.

A reduced power efficiency of the LBMT device 200 is expected because the parasitic collector shield region 232 will collect a portion of the electrons laterally injected from the emitter region 218. It is likely that for large emitter-collector spacing—typically used for increasing the relative lateral collector LBMT sensitivity—substantial electron recombination with holes in the P-base may also occur, which also decreases the overall power efficiency for every type of LBMT device 200.

Advantages of using the LBMT device 100, 200 of the present invention is that it does not require an extrinsic base current to flow through the device to achieve high magnetic field sensitivity. Most known LBMT devices require a fairly large, e.g., several mA, extrinsic base current to flow so that an enhanced Lorentz force on the majority carriers making up the high extrinsic base current can establish an electric field to divert the laterally diffusing minority carriers. In addition, a voltage difference is required to be maintained between two or more base terminals in order to establish the extrinsic base current, and that the extrinsic base current is usually much larger than the injected minority carrier current. For one type of high sensitivity LBMT, one of the two base terminals is required to reverse bias the N+ emitter to P− base junction, thus establishing a SCL that narrows the P-base region as well as causing a large extrinsic base current to flow. The LBMT device 100, 200 of the present invention similarly achieves its high magnetic field sensitivity by a narrowing of the P-base region, but does so via a single base terminal without requiring extrinsic base current to flow; as a result, high magnetic field sensitivity can be obtained at significantly lower power dissipation levels, expected to be on the order of 10 to 100 times lower than any previous LBMT magnetic field sensor. Thus, a significant advantage of the present invention is that it provides an LBMT device 100, 200 with extremely high B-field sensitivity that is best suited for lower power, portable, electronic system applications.

Under extremely high sensitivity bias conditions, i.e., when the base or the channel 248 is extremely narrow, the enhanced LBMT device 100, 200 of the present invention may well operate as a bi-directional magnetic switch rather than a linear device, since all of the laterally diffusing minority carriers will be easily diverted from the lateral collector at small B-field strength levels and for either B-field polarity. The switching performance of the magnetic field may provide a distinct advantage over other types of previously developed magnetic field switches in contactless switching or proximity detection applications since all of the electronic switching action will be done directly within a single LBMT device 100, 200, without the need for a matched pair of sensor devices (one for detecting each B-field polarity) or for the additional offset compensated amplifier circuitry that typically requires substantial power consumption and area on an IC.

It is to be understood by those skilled in the art of semiconductor device physics that all of the other factors governing the maximization of LBMT B-field sensitivity are applicable to the enhanced sensitivity LBMT device 100, 200 of the present invention, e.g., low N⁻ doping for the emitter region, and a large separation from the emitter to the lateral collector region. Note that inherent with B-field sensitivity optimization of the present invention, the base terminal current will be significantly higher than either the emitter or collector currents, and as such, the overall power dissipation of the most sensitive LBMT device 100, 200 will be practically set by the intrinsic base current of the device. However, if markedly increased B-field sensitivity is attained via the present invention without these optimal sensitivity modifications, a sacrifice of 10%–50% loss in maximum sensitivity may be an acceptable trade-off for enhanced current gain, i.e. a significantly reduced intrinsic base current, by using a standard N⁺ emitter region. This will substantially improve the sensor's power efficiency for a given B-field sensitivity. An effective comparison of various LBMT devices involves dividing the relative lateral collector current B-field sensitivity by the total current consumption of the device. It is therefore possible that an LBMT device with a heavily doped N⁺ emitter region may provide the most useful B-field sensitivity for use in ultra-low power portable electronics devices.

It is to be understood that implementing more than one base contact 116, 216 (P⁺ type dopant) near the emitter region 118, 218 in the present invention may increase the B-field sensitivity of the device. In addition, one or two-dimensional arrays of B-field detectors could be utilized with the present invention, or similar implementations.

All references, including publications, patent applications, and patents, cited herein are hereby incorporated by reference to the same extend as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. A magnetic field sensor, comprising:
    a base region;
    an emitter region, wherein the emitter region is disposed in the base region; and
    a collector region, wherein the collector region is disposed in the base region; and
    a barrier region disposed between the emitter region and the collector region to hamper charge carriers injected into the base region from the emitter region from reaching at least a portion of the collector region, and wherein the barrier region is further disposed in the base region.

2. A magnetic field sensor comprising:
    a transistor device including:
        a base region;
        an emitter region;
        a collector region;
        a barrier region disposed between the emitter region and the collector region to hamper charge carriers injected into the base region from the emitter region from reaching at least a portion of the collector region;
    a first biasing source to bias the collector region with respect to the base region to form a space-charge layer associated with the collector region; and
    a second biasing source to bias the barrier region with respect to the base region to control the space-charge layer associated with the barrier region.

3. The magnetic field sensor according to claim 2, further comprising:
    a first sinker region disposed such that the collector region is between the first sinker region and the barrier region, the first sinker region electrically connected to the barrier region.

4. The magnetic field sensor according to claim 3, further comprising:
    a second sinker region disposed such that the emitter region is between the second sinker region and the barrier region, the second sinker region electrically connected to the barrier region.

5. A magnetic field sensor comprising:
    a transistor device comprising:
        a base region;
        an emitter region;
        a collector region;
    a barrier region disposed between the emitter region and the collector region to hamper charge carriers injected into the base region from the emitter region from reaching at least a portion of the collector region;

a substrate region;

a parasitic collector region; and wherein the parasitic collector region is disposed between the base region and the substrate region.

6. The magnetic field sensor according to claim 5, further comprising:

a first sinker region disposed such that the collector region is between the first sinker region and the barrier region, the first sinker region electrically connected to the parasitic collector region.

7. The magnetic field sensor according to claim 6, further comprising:

a second sinker region disposed such that the emitter region is between the second sinker region and the barrier region, the second sinker region electrically connected to the parasitic collector region.

8. A magnetic field sensor, comprising a transistor device including:

a base region;

an emitter region;

a collector region; and a barrier region disposed between the emitter region and the collector region to hamper charge carriers injected into the base region from the emitter region from reaching at least a portion of the collector region;

wherein the base region is a first conductivity type and wherein the emitter region is a second conductivity type and the collector region is the second conductivity type.

9. The magnetic field sensor according to claim 8, wherein the barrier region is the first conductivity type.

10. The magnetic field sensor according to claim 8, wherein the barrier region is the second conductivity type.

* * * * *